(12) United States Patent
Ozawa et al.

(10) Patent No.: US 10,564,236 B2
(45) Date of Patent: Feb. 18, 2020

(54) MAGNETIC RESONANCE IMAGING APPARATUS AND GUIDING METHOD OF COIL SELECTION IN MAGNETIC RESONANCE IMAGING METHOD

(71) Applicant: TOSHIBA MEDICAL SYSTEMS CORPORATION, Otawara-Shi, Tochigi-Ken (JP)

(72) Inventors: Shinya Ozawa, Otawara (JP); Kazuya Tanoue, Utsunomiya (JP); Yoshiteru Watanabe, Nasushiobara (JP); Yoshinari Morita, Utsunomiya (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1510 days.

(21) Appl. No.: 14/169,303

(22) Filed: Jan. 31, 2014

(65) Prior Publication Data
US 2014/0145717 A1 May 29, 2014

Related U.S. Application Data

(63) Continuation of application No. PCT/JP2013/081909, filed on Nov. 27, 2013.

(30) Foreign Application Priority Data

Nov. 28, 2012 (JP) ................. 2012-259917

(51) Int. Cl.
*G01R 33/36* (2006.01)
*G01R 33/54* (2006.01)
*G01R 33/3415* (2006.01)

(52) U.S. Cl.
CPC ...... *G01R 33/3664* (2013.01); *G01R 33/3415* (2013.01); *G01R 33/546* (2013.01)

(58) Field of Classification Search
CPC ............ G01R 33/3415; G01R 33/3664; G01R 33/546; G01R 33/5611; G01R 33/56375
See application file for complete search history.

(56) References Cited

U.S. PATENT DOCUMENTS 6,990,223 B2 * 1/2006 Ma ................... G01R 33/3415
324/309
8,525,517 B2 9/2013 Ichinose
(Continued)

FOREIGN PATENT DOCUMENTS

JP 2008-029834 2/2008
JP 2008-212643 9/2008
(Continued)

OTHER PUBLICATIONS

International Search Report for PCT/JP2013/081909, dated Jan. 21, 2014.
(Continued)

*Primary Examiner* — Rishi R Patel
(74) *Attorney, Agent, or Firm* — Nixon & Vanderhye P.C.

(57) ABSTRACT

According to one embodiment, an MRI apparatus (10) includes a profile data generation unit (68) and a judging unit (65). The profile data generation unit generates a plurality of profile data that respectively correspond to a plurality of coil elements and indicate reception intensity distributions of nuclear magnetic resonance signals. The profile data are generated on the basis of the nuclear magnetic resonance signals from an object detected by the plurality of coil elements of each of a first RF coil device (100) and a second RF coil device (120). The judging unit judges at least one coil element effective for magnetic resonance imaging in each of the first RF coil device and the second RF coil device, by performing analysis of the plurality of profile data
(Continued)

in which the first RF coil device and the second RF coil device are separately analyzed.

3 Claims, 8 Drawing Sheets

(56) References Cited

U.S. PATENT DOCUMENTS

2002/0186870 A1* 12/2002 Ma ..................... G01R 33/3415
382/131
2008/0007263 A1  1/2008 Machida et al.
2010/0259262 A1* 10/2010 Ichinose ............ G01R 33/3415
324/309

FOREIGN PATENT DOCUMENTS

| JP | 2009-106480 | 5/2009 |
| JP | 2010-155021 | 7/2010 |
| JP | 2010-259777 | 11/2010 |

OTHER PUBLICATIONS

English Translation of International Preliminary Report on Patentability dated Jun. 2, 2015 for Application No. PCT/JP2013/081909.

* cited by examiner

| LOWER BODY RF COIL DEVICE | | SPINAL RF COIL DEVICE | |
|---|---|---|---|
| COIL ELEMENT IDENTITY NUMBER | POSITION FROM REPRESENTATIVE POINT | COIL ELEMENT IDENTITY NUMBER | POSITION FROM REPRESENTATIVE POINT |
| 106a | -300 | 126a | -700 |
| 106b | -100 | 126b | -500 |
| 106c | 100 | 126c | -300 |
| 106d | 300 | 126d | -100 |
| | | 126e | 100 |
| | | 126f | 300 |
| | | 126g | 500 |
| | | 126h | 700 |

| COIL ELEMENTS ($\Delta Z \leq 90$, $\Delta Z' \leq 90$) | NORMALIZED MAXIMUM SIGNAL INTENSITY |
|---|---|
| 106a | 0.6 |
| 106b | 1 |
| 106c | 0.63 |
| 106d | 0.4 |
| 126c | 0.30 |
| 126d | 0.42 |
| 126e | 0.40 |
| 126f | 0.25 |

MAGNETIC RESONANCE IMAGING APPARATUS AND GUIDING METHOD OF COIL SELECTION IN MAGNETIC RESONANCE IMAGING METHOD

CROSS-REFERENCE TO RELATED APPLICATIONS

This application is a Continuation Application of No. PCT/JP2013/81909, filed on Nov. 27, 2013, and the PCT application is based upon and claims the benefit of priority from Japanese Patent Application No. 2012-259917, filed on Nov. 28, 2012, the entire contents of which are incorporated herein by reference.

BACKGROUND OF THE INVENTION

1. Field of the Invention

Embodiments described herein relate generally to a magnetic resonance imaging apparatus and a guiding method of coil selection in magnetic resonance imaging method.

2. Description of the Related Art

MRI is an imaging method which magnetically excites nuclear spin of an object (a patient) placed in a static magnetic field with an RF pulse having the Larmor frequency and reconstructs an image based on MR signals generated due to the excitation. The aforementioned MRI means magnetic resonance imaging, the RF pulse means a radio frequency pulse, and the MR signal means a nuclear magnetic resonance signal.

Here, an RF (Radio Frequency) coil device is a device which transmits an RF pulse to nuclear spin inside an object by, for example, supplying a coil with an RF pulse electric current and detects generated echo signals as MR signals. RF coil devices can be classified into a whole body type and a local area type. Various types of the RF coil devices for a local area are used according to an imaging part. For example, in the case of imaging of lower limbs, a dedicated RF coil device for lower limbs is loaded to the lower limbs of an object.

Inside wearable type of RF coil devices, for example, a plurality of coil elements that function as antennas for detecting MR signals are disposed. In the preparation phase of imaging, for example, (each group of) the respective coil elements inside an RF coil device are displayed, and (the groups of) the coil elements used for imaging are selected by a user. As to selection of the coil elements used for imaging, the respective positions of the coil elements are important.

Then, in Patent Document 1, a reception intensity distribution of each coil element to MR signals in the Z axis direction is obtained in order to accurately calculate the respective positions of the coil elements, and a representative position of the RF coil device is calculated on the basis of the peak position of the reception intensity distribution.

[Patent Document 1] Japanese Patent Application Laid-open (KOKAI) Publication No. 2010-259777

In Patent Document 1, the respective positions of the plurality of coil elements are displayed on the basis of the representative position.

Although the invention of Patent Document 1 can calculate the representative position and the position of each coil element with satisfactorily high degree of precision, it is preferable to detect the representative position and the position of each coil element as accurately as possible. For example, the coil elements that are too distant from the magnetic center are considered to have insufficient reception sensitivity for obtaining sufficient image quality, and it is preferable to exclude such coil elements from the coil elements selected for imaging.

Thus, a novel technology to judge (determine) coil elements which are effective for imaging in MRI has been desired, and as one of methods for achieving that, a novel technology to detect position of an RF coil device in MRI more accurately than the conventional technology has been desired.

DETAILED DESCRIPTION

Figure 1:
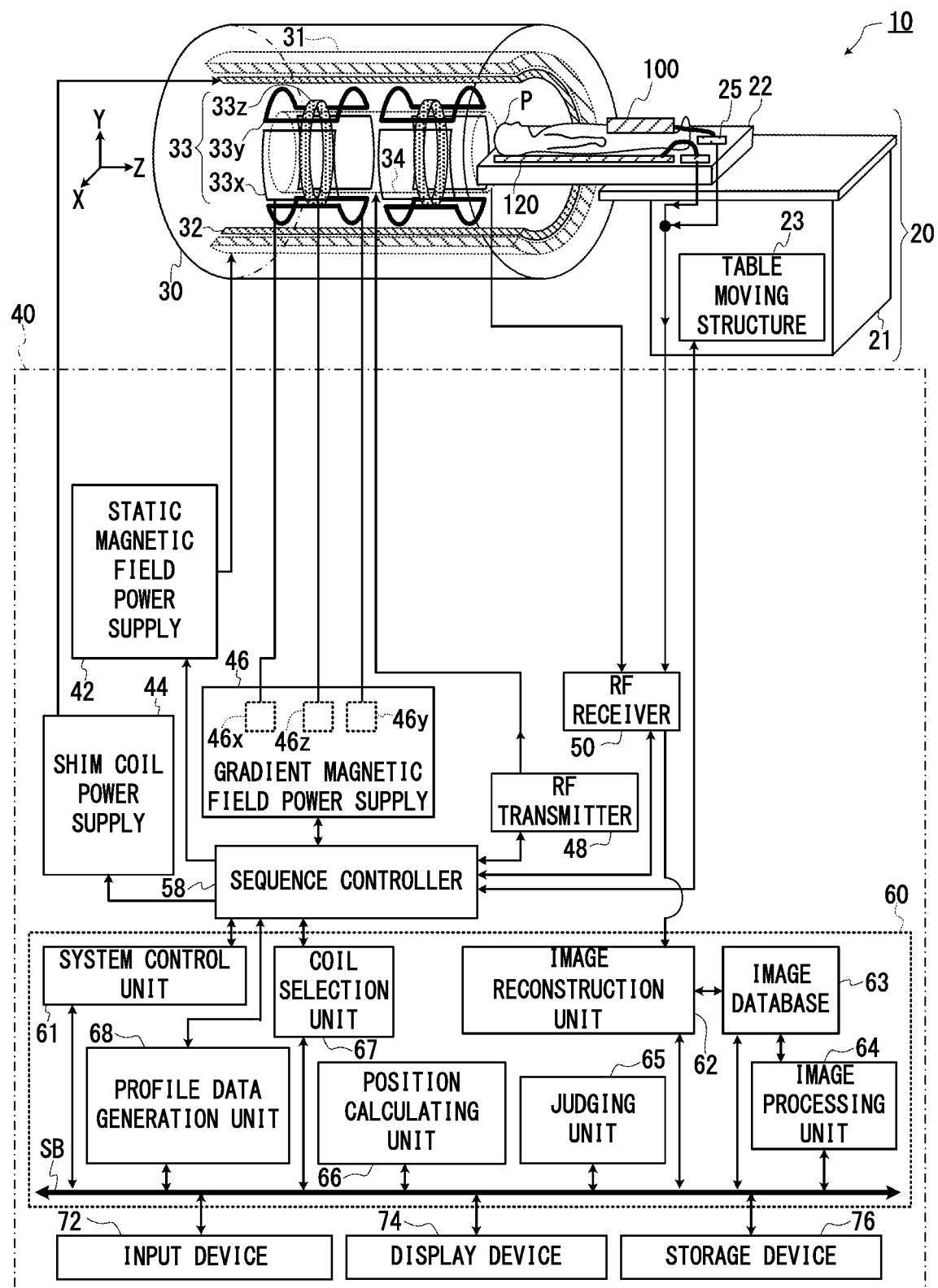
FIG. 1 is a block diagram showing the general structure of the MRI apparatus of the present embodiment.

Hereinafter, examples of aspects which embodiments of the present invention can take will be explained per aspect.

(1) According to one embodiment, an MRI apparatus includes a profile data generation unit and a judging unit.

The profile data generation unit generates a plurality of profile data that respectively correspond to a plurality of coil elements and indicate reception intensity distributions of MR signals, on the basis of MR signals from an object detected by the plurality of coil elements of each of a first RF coil device and a second RF coil device.

The judging unit judges coil elements effective for magnetic resonance imaging in each of the first RF coil device and the second RF coil device, by performing analysis of the plurality of profile data in which the first RF coil device and the second RF coil device are separately analyzed.

(2) According to another embodiment, an MRI apparatus includes a profile data generation unit, a judging unit and a position calculating unit.

The profile data generation unit generates a plurality of profile data that respectively correspond to a plurality of coil elements and indicate reception intensity distributions of MR signals, on the basis of MR signals from an object detected by the plurality of coil elements of at least one RF coil device.

The judging unit stores coil position data indicating relative positional relationship between a representative part of the RF coil device and each coil element, and judges availability of the RF coil device on the basis of the coil position data and the profile data.

The position calculating unit selects at least one of the profile data used for positional calculation of the representative part of the RF coil device in accordance with reception sensitivity of the coil elements indicated by the profile data, out of the plurality of the profile data respectively corresponding to the plurality of coil elements of the RF coil device judged to be available by the judging unit. The position calculating unit calculates the position of the representative part, on the basis of the selected profile data and the coil position data.

(3) According to another embodiment, a guiding method of coil selection in MRI is a method of obtaining guide information in the case of selecting coil elements used for MRI out of coil elements of an RF coil device loaded on an object, and includes the following steps.

One of the steps is to generate a plurality of profile data that respectively correspond to a plurality of coil elements and indicate reception intensity distribution of MR signals, on the basis of MR signals from an object detected by the plurality of coil elements of each of a first RF coil device and a second RF coil device.

The other of the steps is to judge coil elements effective for magnetic resonance imaging in each of the first RF coil device and the second RF coil device, by performing analysis of the plurality of profile data in which the first RF coil device and the second RF coil device are separately analyzed.

An MRI apparatus, an MRI method and a guiding method of coil selection in MRI according to embodiments of the present invention will be described with reference to the accompanying drawings. Note that the same reference numbers are given for identical components in each figure, and overlapping explanation is abbreviated.

Configuration of the Present Embodiment

FIG. 1 is a block diagram showing the general structure of the MRI apparatus 10 according to an embodiment of the present invention. As an example here, the components of the MRI apparatus 10 will be explained by classifying them into three groups which are a bed unit 20, a gantry 30 and a control device 40.

Firstly, the bed unit 20 includes a bed 21, a table 22, and a table moving structure 23 disposed inside the bed 21. An object P is loaded on the top surface of the table 22. In addition, a plurality of connection ports 25 are disposed on the top surface of the table 22. As an example in the present embodiment, a lower limb RF coil device 100 and a spine RF coil device 120 are loaded (set) on the object P. These lower limb RF coil device 100 and the spine RF coil device 120 are respectively connected to the later-described RF receiver 50 via the connection ports 25.

The bed 21 supports the table 22 in such a manner that the table 22 can move in the horizontal direction (i.e. the Z axis direction of the apparatus coordinate system). The table moving structure 23 adjusts the position of the table 22 in the vertical direction by adjusting the height of the bed 21, when the table 22 is located outside the gantry 30. In addition, the table moving structure 23 inserts the table 22 into inside of the gantry 30 by moving the table 22 in the horizontal direction and moves the table 22 to outside the gantry 30 after completion of imaging.

Secondly, the gantry 30 is shaped in the form of a cylinder, for example, and is installed in an imaging room. The gantry 30 includes a static magnetic field magnet 31, a shim coil unit 32, a gradient magnetic field coil unit 33 and an RF coil unit 34.

The static magnetic field magnet 31 is, for example, a superconductivity coil and shaped in the form of a cylinder. The static magnetic field magnet 31 forms a static magnetic field in an imaging space by using electric currents supplied from the later-described static magnetic field power supply 42. The aforementioned "imaging space" means, for example, a space in the gantry 30 in which the object P is placed and to which the static magnetic field is applied. Note that the static magnetic field magnet 31 may include a permanent magnet which makes the static magnetic field power supply 42 unnecessary.

The shim coil unit 32 is, for example, shaped in the form of a cylinder and arranged inside the static magnetic field magnet 31 so as to become coaxial to the static magnetic field magnet 31. The shim coil unit 32 forms an offset magnetic field that uniforms the static magnetic field by using electric currents supplied from the later described shim coli power supply 44 of the control device 40.

The gradient magnetic field coil unit 33 is, for example, shaped in the form of a cylinder and arranged inside the shim coil unit 32. The gradient magnetic field coil unit 33 includes an X axis gradient magnetic field coil 33$x$, a Y axis gradient magnetic field coil 33$y$ and a Z axis gradient magnetic field coil 33$z$.

In this specification, the X axis, the Y axis and the Z axis are assumed to be those of the apparatus coordinate system unless otherwise specifically noted.

As an example here, the apparatus coordinate system, whose X axis, Y axis and Z axis are perpendicular to each other, is defined as follows. Firstly, the Y axis direction is defined as the vertical direction, and the table 22 is disposed in such a position that the direction of the normal line of its top surface accords with the Y axis direction. The horizontal moving direction of the table 22 is defined as the Z axis direction, and the gantry 30 is installed in such a manner that its axis direction accords with the Z axis direction. The X axis direction is the direction perpendicular to these Y axis direction and Z axis direction, and is the width direction of the table 22 in the example of FIG. 1.

The X axis gradient magnetic field coil 33$x$ forms a gradient magnetic field Gx in the X axis direction in an imaging region in accordance with an electric current supplied from the later-described X axis gradient magnetic field power supply 46$x$. Similarly, the Y axis gradient magnetic field coil 33$y$ forms a gradient magnetic field Gy in the Y axis direction in the imaging region in accordance with an electric current supplied from the later-described Y axis gradient magnetic field power supply 46$y$. Similarly, the Z axis gradient magnetic field coil 33$z$ forms a gradient magnetic field Gz in the Z axis direction in the imaging region in accordance with an electric current supplied from the later-described Z axis gradient magnetic field power supply 46z.

Thereby, directions of a gradient magnetic field Gss in a slice selection direction, a gradient magnetic field Gpe in a phase encoding direction and a gradient magnetic field Gro in a readout (frequency encoding) direction can be arbitrarily selected as logical axes, by combining the gradient magnetic fields Gx, Gy and Gz in the X axis, the Y axis and the Z axis directions as three physical axes of the apparatus coordinate system.

The above "imaging region" means, for example, at least a part of an acquisition range of MR signals used to generate one image or one set of image, which becomes an image. The imaging region is defined as a part of the imaging space in terms of range and position by the apparatus coordinate system, for example. For example, when MR signals are acquired in a range wider than a region made into an image in order to prevent wraparound artifact, the imaging region is a part of the acquisition range of MR signals. On the other hand, in some cases, the entire acquisition range of MR signals becomes an image, and the imaging region accords with the acquisition range of MR signals. In addition, the above "one set of image" means, for example, a plurality of images when MR signals of the plurality of images are acquired in a lump in one pulse sequence such as multi-slice imaging.

The RF coil unit 34 is, for example, shaped in the form of a cylinder and arranged inside the gradient magnetic field coil unit 33. The RF coil unit 34 includes, for example, a whole body coil (not shown) that performs transmission of RF pulses and detection of MR signals and a transmission RF coil (not shown) that performs transmission of RF pulses only.

Thirdly, the control device 40 includes the static magnetic field power supply 42, the shim coli power supply 44, a gradient magnetic field power supply 46, an RF transmitter 48, an RF receiver 50, a sequence controller 58, an operation device 60, an input device 72, a display device 74 and the storage device 76.

The gradient magnetic field power supply 46 includes the X axis gradient magnetic field power supply 46x, the Y axis gradient magnetic field power supply 46y and the Z axis gradient magnetic field power supply 46z.

The X axis gradient magnetic field power supply 46x, the Y axis gradient magnetic field power supply 46y and the Z axis gradient magnetic field power supply 46z supply the respective electric currents for forming the gradient magnetic field Gx, the gradient magnetic field Gy and the gradient magnetic field Gz to the X axis gradient magnetic field coil 33x, the Y axis gradient magnetic field coil 33y and the Z axis gradient magnetic field coil 33z, respectively.

The RF transmitter 48 generates RF pulse electric currents of the Larmor frequency for causing nuclear magnetic resonance in accordance with control information inputted from the sequence controller 58, and outputs the generated RF pulse electric currents to the RF coil unit 34. The RF pulses in accordance with these RF pulse electric currents are transmitted from the RF coil unit 34 to the object P.

The whole body coil of the RF coil unit 34, the lower limb RF coil device 100 and the spine RF coil device 120 detect MR signals generated due to excited nuclear spin inside the object P by the RF pulses and the detected MR signals are inputted to the RF receiver 50.

The RF receiver 50 generates raw data which are digitized complex number data of MR signals obtained by performing predetermined signal processing on the received MR signals and then performing A/D (analogue to digital) conversion on them.

The RF receiver 50 inputs the generated raw data of MR signals to the late-described image reconstruction unit 62 of the operation device 60.

The sequence controller 58 stores control information needed in order to make the gradient magnetic field power supply 46, the RF transmitter and the RF receiver 50 drive in accordance with commands from the operation device 60. The aforementioned control information includes, for example, sequence information describing operation control information such as intensity, application period and application timing of the pulse electric currents which should be applied to the gradient magnetic field power supply 46.

The sequence controller 58 generates the gradient magnetic fields Gx, Gy and Gz and RF pulses by driving the gradient magnetic field power supply 46, the RF transmitter 48 and the RF receiver 50 in accordance with a predetermined sequence stored.

The operation device 60 includes a system control unit 61, a system bus SB, an image reconstruction unit 62, a image database 63, an image processing unit 64, a judging unit 65, a position calculating unit 66, a coil selection unit 67 and a profile data generation unit 68.

The system control unit 61 performs system control of the MRI apparatus 10 in setting of imaging conditions of a main scan, an imaging operation and image display after imaging through interconnection such as the system bus SB.

The aforementioned term "imaging condition" refers to under what condition RF pulses or the like are transmitted in what type of pulse sequence, or under what condition MR signals are acquired from the object P, for example.

As parameters of the imaging conditions, for example, there are the imaging region as positional information in the imaging space, a flip angle, a repetition time (TR), the number of slices, an imaging part and the type of the pulse sequence such as spin echo and parallel imaging. The above "imaging part" means a region of the object P to be imaged, such as a head, a chest, and an abdomen.

The aforementioned "main scan" is a scan for imaging an intended diagnosis image such as a T1 weighted image, and it does not include a scan for acquiring MR signals for a scout image or a calibration scan. A scan is an operation of acquiring MR signals, and it does not include image reconstruction processing.

The calibration scan is a scan for determining unconfirmed elements of imaging conditions, conditions and data used for image reconstruction processing and correction processing after the image reconstruction, and the calibration is performed separately from the main scan.

In addition, the system control unit 61 makes the display device 74 display screen information for setting imaging conditions, sets the imaging conditions on the basis of command information from the input device 72, and inputs the determined imaging conditions to the sequence controller 58. In addition, the system control unit 61 makes the display device 74 display images indicated by the generated display image data after completion of imaging.

The input device 72 provides a user with a function to set the imaging conditions and image processing conditions.

The image reconstruction unit 62 arranges and stores the raw data of MR signals inputted from the RF receiver 50 as k-space data, in accordance with the phase encode step number and the frequency encode step number. The above k-space means a frequency space. The image reconstruction unit 62 generates image data of the object P by performing image reconstruction processing including such as two-dimensional Fourier transformation and so on. The image reconstruction unit 62 stores the generated image data in the image database 63.

The image processing unit 64 takes in the image data from the image database 63, performs predetermined image processing on them, and stores the image data after the image processing in the storage device 66 as display image data.

The storage device 76 stores the display image data after adding accompanying information such as the imaging conditions used for generating the display image data and information of the object P (patient information) to the display image data.

The profile data generation unit 68 generates profile data per coil element, on the basis of the MR signals detected by each coil element of the RF coil device (in the example of FIG. 1, the lower limb RF coil device 100 and the spine RF coil device 120) loaded on the object P.

The profile data are generated by a coil position measuring sequence, and indicate spatial distribution of reception intensity of MR signals detected by each coil element.

As an example in the present embodiment, the profile data generation unit 68 generates the profile data on the basis of the apparatus coordinate system, by using the original point of the apparatus coordinate system as a benchmark.

The judging unit 65 preliminarily stores the coil position data of the respective RF coil devices from before a start of the coil position measuring sequence. The coil position data indicates the relative positional relationship between a position of a representative point of an RF coil device and a position of a representative point of each coil element inside this RF coil device.

A representative point of an RF coil device means a reference point used for specifying the position of this RF coil device, and the center point or the gravity point (i.e. barycentric position) of this RF coil device may be used as the representative point, for example.

In addition, a representative point of a coil element means a reference point used for specifying the position of this coil element, and the center point or the gravity point of the conducting wire functioning as an antenna of this coil element may be used as the reference point.

The MRI apparatus 10 can use a wide variety of wearable type of RF coil devices such as a head RF coil device, a chest part RF coil device and so on, in addition to the lower limb RF coil device 100 and the spine RF coil device 120. The coil position data of these RF coil devices are stored per RF coil device in the judging unit 65.

In the coil position measuring sequence, the judging unit 65 judges (determines) whether or not the (loaded) RF coil device is available, on the basis of the coil position data and the profile data. The above "available (availability)" means, for example, that an RF coil device is located sufficiently close to the magnetic field center and accordingly this RF coil device includes at least one coil element capable of detecting MR signals from the object P with enough sensitivity to obtain satisfactory image quality.

In the coil position measuring sequence, the position calculating unit 66 calculates the position of the representative point of the RF coil device which the judging unit has judged to be available, on the basis of the profile data and the coil position data.

The coil selection unit 67 selects coil elements that are used for detecting MR signals in imaging (the main scan).

Note that, though the lower limb RF coil device 100 and the spine RF coil device 120 are explained as a part of the MRI apparatus 10, these RF coil devices may be interpreted as units independent from the MRI apparatus 10. This point holds true for other RF coil devices used for the MRI apparatus 10 such as the head RF coil device and so on.

In addition, the operation device 60, the input device 72, the display device 74 and the storage device 76 may be configured as one computer and may be installed in a control room, for example.

In addition, though the components of the MRI apparatus 10 are classified into three groups (the gantry 30, the bed unit 20 and the control device 40), this is only an example of interpretation.

For example, the table moving structure 23 may be interpreted as a part of the control device 40.

Alternatively, the RF receiver 50 may be included not outside the gantry 30 but inside the gantry 30. In this case, for example, an electronic circuit board that is equivalent to the RF receiver 50 may be disposed in the gantry 30. Then, the MR signals, which are analog electrical signals converted from the electromagnetic waves by the RF coil device and so on, may be amplified by a pre-amplifier in the electronic circuit board, then the amplified signals may be outputted to the outside of the gantry 30 as digital signals and inputted to the image reconstruction unit 62. In outputting the signals to the outside of the gantry 30, for example, an optical communication cable is preferably used to transmit the signals in the form of optical digital signals. This is because the effect of external noise is reduced.

Figures 2, 3:
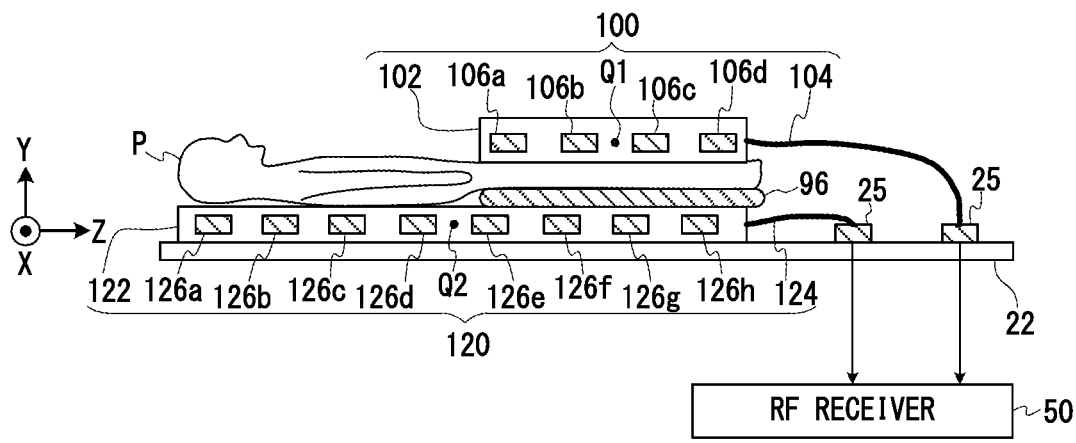
FIG. 2 is a schematic cross-sectional diagram showing an example of the arrangement of the respective coil elements in a lower limb RF coil device and a spine RF coil device.
FIG. 3 is a table showing an example of the coil position data for the lower limb RF coil device and the coil position data for the spine RF coil device.

FIG. 2 is a schematic cross-sectional diagram showing an example of the arrangement of the respective coil elements in the lower limb RF coil device 100 and the spine RF coil device 120.

As shown in FIG. 2, as an example in the present embodiment, a cushion 96 is placed on the top surface of the table 22, and both legs of the object P are placed on the cushion 96. This is so that the entire body axis of the object P becomes in parallel with the Z axis direction.

The lower limb RF coil device 100 is composed as a wearable type of RF coil device for detecting MR signals, and includes a cover member 102 and a cable 104. Inside the cover member 102, four coil elements 106a, 106b, 106c and 106d for detecting MR signals are arranged. These coil elements 106a to 106d are respectively electrically connected to separate wirings inside the cable 104 by heretofore known circuits (not shown) including such as an amplifier inside the cover member 102. The cable 104 includes a connector (not shown) on its one end, and the coil elements 106a to 106d are connected to the RF receiver 50 by connecting this connector to the connection port 25.

In addition, a control circuit (not shown), that performs control of selection of the coil elements (106a to 106d) and stores the identification information of the lower limb RF coil device 100, is disposed inside the cover member 102.

When the cable 104 is connected to the connection port 25, the identification information of the lower limb RF coil device 100 is inputted to the system control unit 61 from the control circuit via hard-wiring inside the MRI apparatus 10. In addition, as an example here, the center of the cover member 102 is defined as the representative point Q1 of the lower limb RF coil device 100.

The spine RF coil device 120 is composed as a wearable type of RF coil device for detecting MR signals, and includes a cover member 122 and a cable 124. Inside the cover member 122, eight coil elements 126a to 126h for detecting MR signals are arranged. The coil elements 126a to 126h are respectively electrically connected to separate wirings inside the cable 124 by heretofore known circuits (not shown) including such as an amplifier inside the cover member 122. The cable 124 includes a connector (not shown) on its one end, and the coil elements 126a to 126h are connected to the RF receiver 50 by connecting this connector to the connection port 25.

In addition, a control circuit (not shown), that performs control of selection of the coil elements (126a to 126h) and stores the identification information of the spine RF coil device 120, is disposed inside the cover member 122 in the same way as mentioned above. As an example here, the center of the cover member 122 is defined as the representative point Q2 of the spine RF coil device 120.

One of the characteristics of the present embodiment lies in that a position of a representative point of an RF coil device and a position of each coil element are judged by the novel coil position measuring sequence more exactly than the conventional technology. Before explanation of the coil position measuring sequence, FIG. 3 to FIG. 7 used for its explanation will be explained as follows.

FIG. 3 is a table showing an example of the coil position data for the lower limb RF coil device 100 and the coil position data for the spine RF coil device 120. For the sake of simplifying the explanation of positional calculation of the coil elements here, the arrangement of the respective coil elements is interpreted as one-dimensional and assumed to be as follows.

Firstly, each coil element (106a to 106d and 126a to 126h) is one-dimensionally arranged inside the cover member (102 or 122).

Secondly, the lower limb RF coil device 100 and the spine RF coil device 120 are loaded on the object P on the table 22 in such a manner that the arrangement direction of the coil elements approximately accords with the Z axis direction.

As an example in the coil position data shown in FIG. 3, the relative positional relationship between the representative point and each coil element is indicated as a distance from the representative point to the center point of each coil element in the arrangement direction of the coil elements and direction symbol (i.e. positive or negative).

In the case of the lower limb RF coil device 100, the positive direction is the direction from the representative point Q1 to the center of the coil element 106d, and the negative direction is its opposite direction (see FIG. 2).

Similarly, in the case of the spine RF coil device 120, the positive direction is the direction from the representative point Q2 to the center of the coil element 126h, and the negative direction is the opposite direction (see FIG. 2).

For example, according to the coil position data of the lower limb RF coil device 100 shown in FIG. 3, the coil element 106b is away from the representative point Q1 by 100 (unit of distance is, for example, millimeter) in the direction from the representative point Q1 to the center of the coil element 106a.

Figure 4:
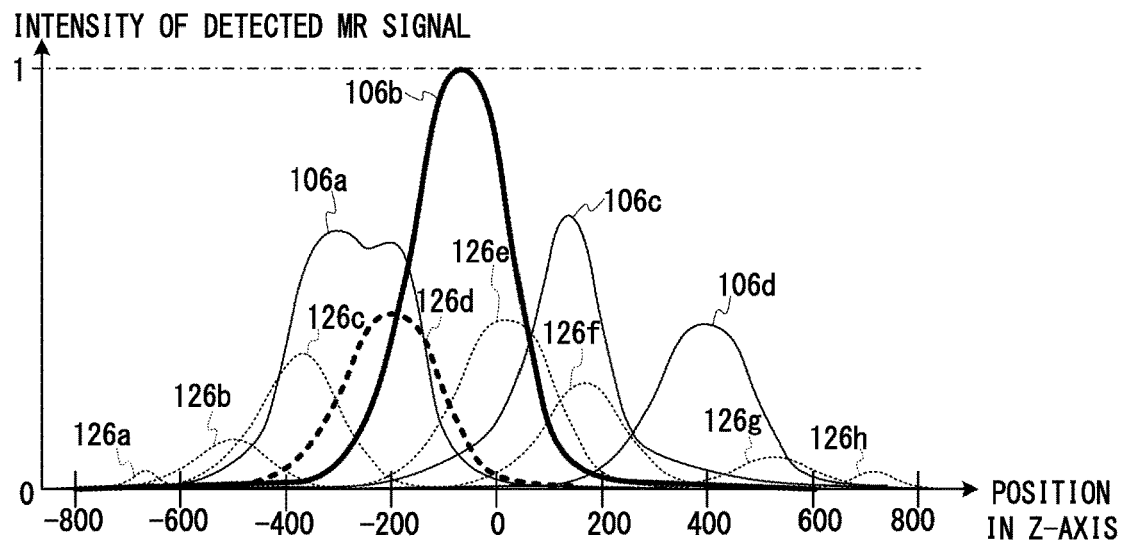
FIG. 4 is a schematic diagram showing an example of the profile data of all the coil elements of the lower limb RF coil device and the spine RF coil device.

FIG. 4 is a schematic diagram showing an example of the profile data of all the coil elements of the lower limb RF coil device 100 and the spine RF coil device 120.

In FIG. 4, the horizontal axis indicates the position on the Z axis direction of the apparatus coordinate system, and it is assumed that the magnetic field center accords with the original point of the apparatus coordinate system (X=0, Y=0, Z=0), as an example here. The vertical axis indicates intensity of MR signals detected by each of the coil elements 106a to 106d and 126a to 126h.

In FIG. 4, the reception intensity distributions of the respective coil elements 106a to 106d of the lower limb RF coil device 100 to MR signals are indicated as solid lines, and the reception intensity distributions of the respective coil elements 126a to 126h of the spine RF coil device 120 to MR signals are indicated as dashed lines.

In addition, the one whose reception intensity at the peak is the highest in the lower limb RF coil device 100 (in this example, the coil element 106b) is indicated as a bold line, and the one whose reception intensity at the peak is the highest in the spine RF coil device 120 (in this example, the coil element 126d) is indicated as a bold line.

As an example here, values of the vertical axis are normalized by using the highest signal intensity of all the coil elements of the lower limb RF coil device 100 and the spine RF coil device 120 (in this example, the peak reception intensity of the coil element 106b at Z=−33).

Figure 5:
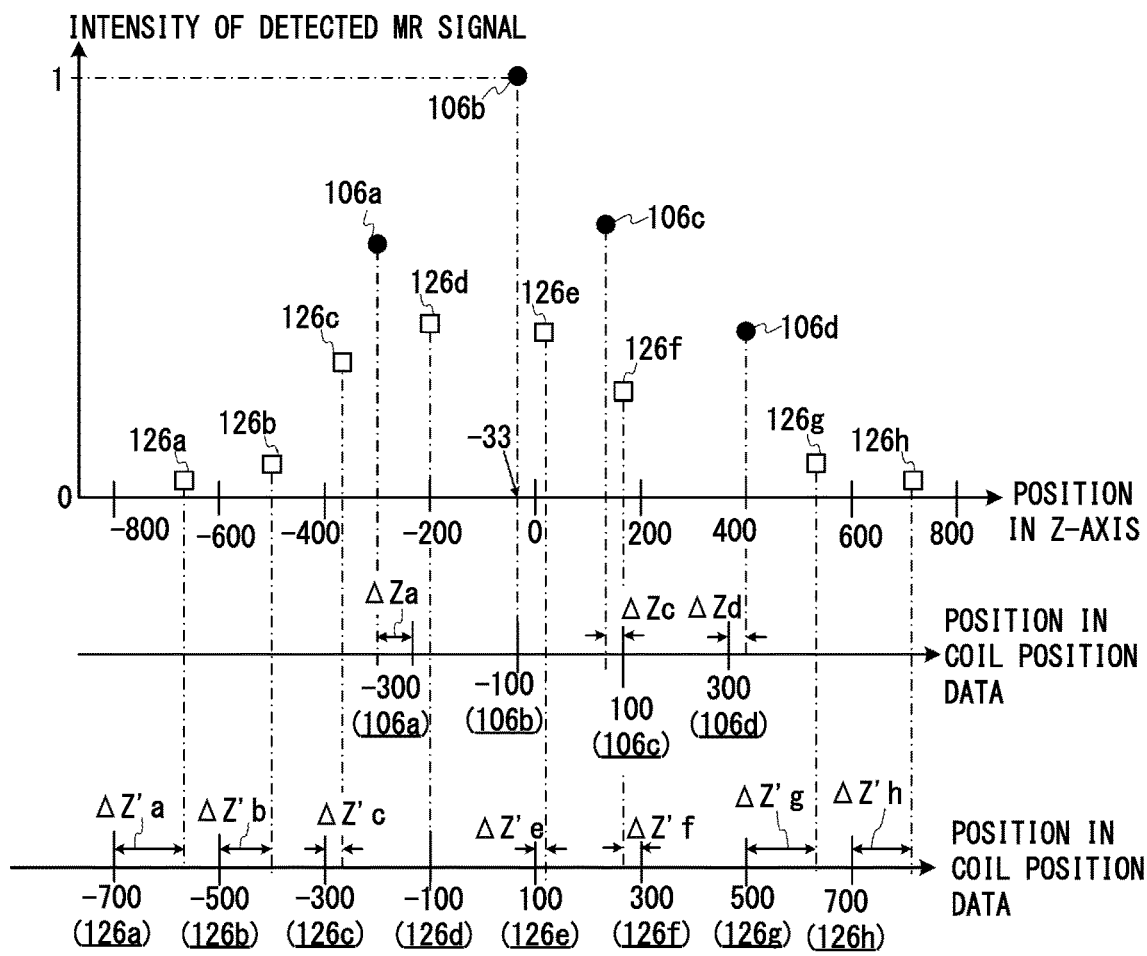
FIG. 5 is a schematic diagram plotting the peak value of the reception intensity of each coil element on the basis of the respective profile data, so as to compare the peak position with the coil position data.

FIG. 5 is a schematic diagram plotting the peak value of the reception intensity of each of the coil elements 106a to 106d and 126a to 126h on the basis of the respective profile data, so as to compare the peak positions with the coil position data.

In the upper part of FIG. 5, the vertical axis and the horizontal axis are the same as FIG. 4, the circular plots indicate the peak value of the reception intensity of each of the coil elements 106a to 106d of the lower limb RF coil device 100, and the box-shaped plots indicate the peak value of the reception intensity of each of the coil elements 126a to 126h of the spine RF coil device 120.

The middle part of FIG. 5 is a comparison between the respective positions of the coil elements 106a to 106d indicated by the profile data and the respective positions of the coil elements 106a to 106d indicated by the coil position data of the lower limb RF coil device 100.

The bottom part of FIG. 5 is a comparison between the respective positions of the coil elements 126a to 126h indicated by the profile data and the respective positions of the coil elements 126a to 126h indicated by the coil position data of the spine RF coil device 120.

Details of the middle part and the bottom part of FIG. 5 will be explained later in the flow chart of FIG. 8 with the coil position measuring sequence.

Figures 6, 7:
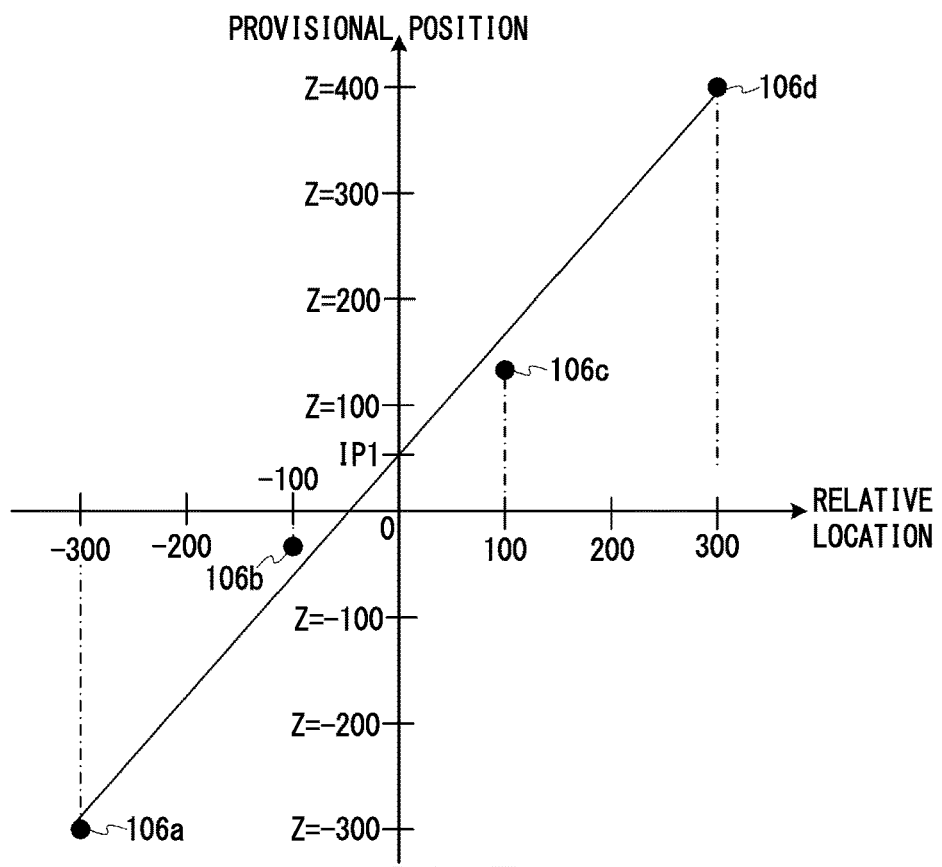
FIG. 6 is a reference chart of the position of each of the selected coil elements whose gap between the position indicated by the profile data and the position indicated by the coil position data is equal to or less than a setting value.
FIG. 7 is a graph showing a method of calculating the position of the representative point on the basis of the profile data of the coil elements, each of which has reception intensity at the peak equal to or higher than the threshold value.

FIG. 6 is a reference chart of the position of each of the selected coil elements whose gap between the position indicated by the profile data and the position indicated by the coil position data is equal to or less than a setting value, out of the respective coil elements 106a to 106d and 126a to 126. As to the method of determining the above "setting value", it will be explained with flow of the coil position measuring sequence in FIG. 8.

FIG. 7 is a graph showing a method of calculating the position of the representative point on the basis of the profile data of the coil elements, each of which has reception intensity at the peak equal to or higher (larger) than the threshold value.

More specifically, out of the coil elements 106a to 106d of the lower limb RF coil device 100 selected for the table of FIG. 6, at least one coil element that satisfies a statistical threshold value is further selected, and the position of the representative point Q1 is calculated on the basis of the profile data of the further selected coil element(s). The method of determining the statistical threshold value and the method of calculating the position of the representative point Q1 will be explained with flow of the coil position measuring sequence in FIG. 8.

Note that, in FIG. 7, the horizontal axis (the X axis) indicates the relative position of each of the coil elements 106a to 106d by placing the representative point Q1 shown by the coil position data on the criterion (X=0). The vertical axis (the Y axis) in FIG. 7 indicates the provisional position of each of the coil elements 106a to 106d by placing the original point of the apparatus coordinate system on the criterion (Y=0). The provisional position means a position of each coil element provisionally measured on the basis of the profile data, before finally calculating the position of each coil element.

Figure 8:
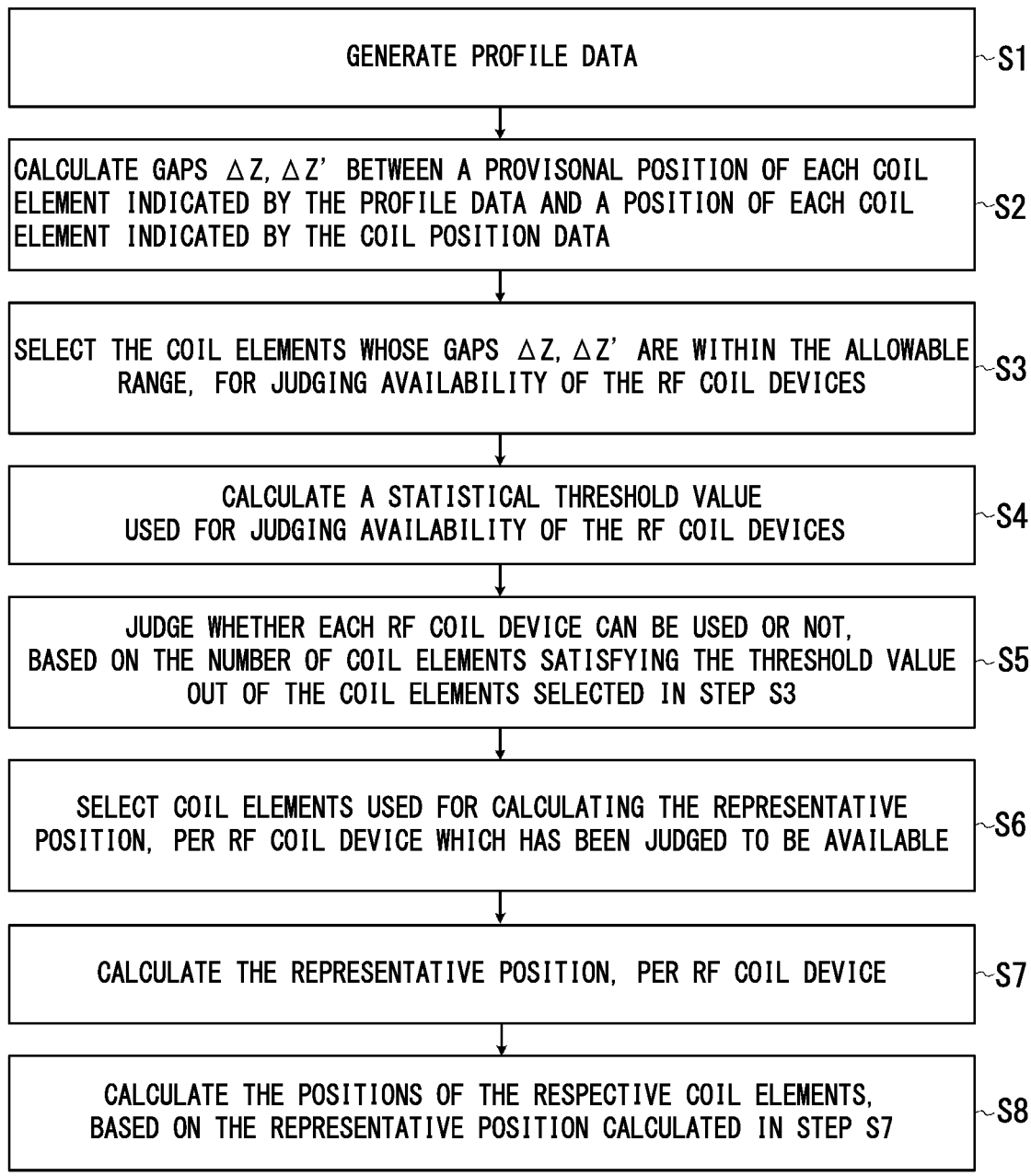
FIG. 8 is a flowchart illustrating an example of a flow of the operation of the coil position measuring sequence performed by the MRI apparatus of the present embodiment.

FIG. 8 is a flowchart illustrating an example of a flow of the operation of the coil position measuring sequence performed by the MRI apparatus 10 of the present embodiment. In the following, according to the step numbers in the flowchart shown in FIG. 8, the flow of the coil position measuring sequence will be described by referring to the aforementioned FIG. 1 to FIG. 7 as required.

[Step S1] The system control unit 61 (see FIG. 1) controls each component of the MRI apparatus 10 so as to perform a one-dimensional sequence of acquiring MR signals in the Z axis direction on the basis of, for example, spin echo sequence.

Thereby, the MR signals acquired per coil element are inputted from the RF receiver 50 to the profile data generation unit 68.

The profile data generation unit 68 generates the reception intensity distributions of the respective coil elements 106a to 106d and 126a to 126h of the lower limb RF coil device 100 and the spine RF coil device 120 to MR signals in the Z axis direction, as the profile data per coil element (see FIG. 4).

The judging unit 65 judges the maximum value of the reception intensity of MR signals of all the profile data of the coil elements 106a to 106d of the lower limb RF coil device 100, and defines this value as the maximum reception intensity CAmax.

The position in the Z axis direction where the maximum reception intensity CAmax is obtained is defined as the provisional position PA.

In the example of FIG. 4 and FIG. 5, the reception intensity of the coil element 106b at the provisional position PA (Z=−33) is stored as the maximum reception intensity CAmax in the judging unit 65.

The judging unit 65 judges the maximum value of the reception intensity of MR signals of all the profile data of the coil elements 126a to 126h of the spine RF coil device 120, and defines this value as the maximum reception intensity CBmax.

The position in the Z axis direction where the maximum reception intensity CBmax is obtained is defined as the provisional position PB.

In the example of FIG. 4 and FIG. 5, the reception intensity of the coil element 126d at the provisional position PB (Z=−200) is stored as the maximum reception intensity CBmax in the judging unit 65.

[Step S2] The judging unit 65 judges and stores each position in the Z axis direction where the maximum value of the reception intensity in the profile data is obtained for all of the other coil elements that do not correspond to the maximum reception intensity CAmax or CBmax.

Next, as to the lower limb RF coil device 100, the judging unit 65 calculates each gap (difference) AZ between the provisional position of each of the coil elements 106a to 106d indicated by the profile data and the position of each of the coil elements 106a to 106d indicated by the coil position data (see the left column of FIG. 3). This calculation is performed by using the provisional position PA of the coil element 106b showing the maximum reception intensity CAmax as a criterion.

More specifically, the judging unit 65 calculates the first accordance condition in which the position of the coil element 106b indicated by the coil position data of the lower limb RF coil device 100 and the provisional position PA of the coil element 106b indicated by the profile data accord with each other.

If the representative point Q1 of the lower limb RF coil device 100 accords with the original point of the apparatus coordinate system, the provisional position PA of the coil element 106b should be Z=−100 according to the coil position data (see the left column of FIG. 3). However, the provisional position PA of the coil element 106b is Z=−33 (see the upper part of FIG. 5).

Thus, the judging unit 65 calculates the condition of shifting the position indicated by the coil position data by 67 in the positive direction along the Z axis, as the first accordance condition. Thereby, positions indicated by the coil position data are obtained for the other coil elements 106a, 106c and 106d.

That is, the horizontal axis of the middle part of FIG. 5 is obtained by shifting the horizontal axis of the upper part of FIG. 5 by 67 in the positive direction along the Z axis, so that the position of the coil element 106b indicated by the coil position data accords with the provisional position PA of the coil element 106b.

Note that, out of the two stage scales of the horizontal axis of the middle part of FIG. 5, the upper side indicates positions by using the representative point Q1 as a criterion, and the lower side indicates the respective symbols of the corresponding coil elements in parentheses (the same holds true for the bottom part of FIG. 5).

As to the other coil elements 106a, 106c and 106d, the judging unit 65 respectively calculates the gaps ΔZa, ΔZc and ΔZd between the positions indicated by the coil position data and the provisional positions, under the first accordance condition. For example, though the provisional position of the coil element 106d is Z=400 in the upper part of FIG. 5, its position stipulated by the coil position data under the first accordance condition is 300+67=367 (300 is the value of the coil element 106d of the coil position data in FIG. 3). That is, the position corresponding to scale 300 of the horizontal axis in the middle part of FIG. 5 is a position of Z=367 in the upper part of FIG. 5, and the gap between this Z=367 and the provisional position 400 of the coil element 106d is calculated as ΔZd=33.

Next, as to the spine RF coil device 120, the judging unit 65 calculates each gap ΔZ' between the provisional position of each of the coil elements 126a to 126h indicated by the profile data and the position of each of the coil elements 126a to 126h indicated by the coil position data. This calculation is performed by using the provisional position PB of the coil element 126d showing the maximum reception intensity CBmax as a criterion.

In the same way as mentioned above, the judging unit 65 calculates the second accordance condition in which the position of the coil element 126d indicated by the coil position data of the spine RF coil device 120 (see the right column of FIG. 3) accords with the provisional position PB of the coil element 126d indicated by the profile data.

That is, the horizontal axis of the bottom part of FIG. 5 is obtained by shifting the horizontal axis of the upper part of FIG. 5 by 100 in the negative direction along the Z axis as the second accordance condition, so that the position of the coil element 126d indicated by the coil position data accords with the provisional position PB of the coil element 126d.

As to the other coil elements 126a to 126c and 126e to 126h, the judging unit 65 calculates the gaps ΔZa' to ΔZ'c and ΔZ'e to ΔZ'h between the positions indicated by the coil position data and the provisional positions, under the second accordance condition.

[Step S3] The judging unit 65 selects (the profile data of) the coil element(s) whose gap between the position indicated by the coil position data and the provisional position is within an acceptable range, for judging availability of the RF coil device. Note that, as to selection target, interpreting it as the selection of the coil elements is technically equivalent to interpreting it as the selection of the profile data of the coil element(s). However, the profile data are used for judging availability of the RF coil device.

As an example here, as to the gaps ΔZa to ΔZd and ΔZ'a to ΔZ'h, the judging unit 65 selects the coil elements whose absolute values are equal to or less than a predetermined value (for example, 90). Note that, the coil elements 106b and 126d showing the maximum reception intensity CAmax and CBmax are necessarily selected because ΔZb=0 and ΔZ'd=0. In addition, though the above predetermined value is common to the lower limb RF coil device 100 and the spine RF coil device 120, mutually different values may be used per RF coil device.

In the example of the present embodiment, the coil elements 106a to 106d are selected for the lower limb RF coil device 100, and the coil elements 126c to 126f are selected for the spine RF coil device 120 (see FIG. 6).

[Step S4] As to the lower limb RF coil device 100 and the spine RF coil device 120, the judging unit 65 calculates a statistical threshold value Th which is commonly used for judgment of availability of both RF coil devices.

Here, the average value and dispersion of the reception intensity of the MR signals at each peak of all the coil elements selected in Step S3 are respectively defined as μ and σ. The judging unit calculates the threshold value Th by using the following equation, for example.

$$Th = \mu - (N \times \sigma) \quad (1)$$

In the equation (1), N is a natural number and values such as 3 and 4 can be used for it, for example.

Note that, as the threshold value Th, the equation (1) is only an example, and the average value μ may be used for the threshold value Th as another example.

Alternatively, as the threshold value Th, a standard deviation ($\mu - \sqrt{\sigma}$) may be used.

In the case of FIG. 6, the average value of the reception intensity at each peak of the eight coil elements is 0.5 and the dispersion is 0.05. As an example here, the judging unit 65 calculates the threshold value Th=0.4 (this is the case of N=2 in the equation (1)).

[Step S5] If an RF coil device includes at least one coil element whose reception intensity of MR signals at the peak is not lower than the threshold value Th out of the coil elements selected for judgment of availability in Step S3, the judging unit 65 judges this RF coil device to be available because it is located adjacent to the magnetic field center.

On the other hand, if an RF coil device does not include any coil element whose reception intensity of MR signals at the peak is equal to or higher than the threshold value Th out of the coil elements selected for judgment of availability in Step S3, the judging unit 65 judges this RF coil device to be unavailable.

In the example of FIG. 4 to FIG. 6, the lower limb RF coil device 100 is judged to be available, because the reception intensity at each peak of the four coil elements out of the four coil elements 106a to 106d selected in Step S3 is equal to or higher than the threshold value Th.

The spine RF coil device 120 is judged to be available, because the reception intensity at each peak of the coil element 126d and 126e out of the four coil elements 126c to 126f selected in Step S3 is equal to or higher than the threshold value Th.

Note that, the above method of judging availability of each RF coil device is only an example. For example, the judging unit 65 may judge an RF coil device to be available, if this RF coil device includes at least two coil elements whose reception intensity at each peak is not lower than the threshold value Th out of the coil elements selected in Step S3.

Alternatively, the judging unit 65 may judge an RF coil device to be available, if this RF coil device satisfies the following condition. That is, out of all the coil elements selected in Step S3 in this RF coil device, equal to or higher (larger) than a predetermined rate (such as 15%) of the coil elements have the peak reception intensity (of MR signals) not lower than the threshold value Th.

[Step S6] The position calculating unit 66 selects at least one coil element used for the positional calculation of the representative point, per the RF coil device judged to be available in Step S5. As to the above selection target, though interpreting it as selection of the coil element(s) is technically equivalent to interpreting it as selection of the profile data of the coil element(s), the profile data are used for the positional calculation of the representative point.

As to the above selection, the largest value of all the peak values of the reception intensity of MR signals in each of the RF coil devices is used.

More specifically, out of all (the profile data of) the coil elements 106a to 106d inside the lower limb RF coil device 100, the position calculating unit 66 selects the one(s) whose peak vale of the reception intensity of MR signals is not lower than the predetermined proportion (rate) RA of the maximum reception intensity CAmax, for the positional calculation of the representative point Q1.

Similarly, out of all (the profile data of) the coil elements 126a to 126h inside the spine RF coil device 120, the position calculating unit 66 selects the one(s) whose peak value of the reception intensity of MR signals is not lower than the predetermined proportion RA of the maximum reception intensity CBmax, for the positional calculation of the representative point Q2.

As an example here, the predetermined proportion RA is assumed to be 50%. In this case, four coil elements 106a to 106d are selected for the lower limb RF coil device 100, and four coil elements 126c to 126f are selected for the spine RF coil device 120. Note that, it is enough to determine the predetermined proportion RA within the range of 20% to 70%, for example, and it may be 55% or 20%.

In addition, as an example in the present embodiment, if only one coil element that has the maximum reception intensity (CAmax or CBmax) is selected for the positional calculation of the representative point for each RF coil device, the position calculating unit 66 decreases the predetermined proportion RA in a stepwise fashion in such a manner that a plurality of coil elements are selected.

[Step S7] The position calculating unit 66 calculates the position of the representative point per the RF coil device judged to be available in Step S5. In order to achieve that, the position calculating unit 66 calculates the gap (difference) D1 between the representative point Q1 of the lower limb RF coil device 100 and the original point of the apparatus coordinate system (in this example, the original point is the magnetic field center).

More specifically, the position calculating unit 66 generates a graph like FIG. 7 as to the coil elements 106a to 106d of the lower limb RF coil device 100 selected in Step S6. In each plot of the coil elements 106a to 106d in FIG. 7, the X-coordinate value (the horizontal axis value) indicates the position of each of the coil elements 106a to 106d standardized by the representative point Q1 on the basis of the coil position data.

In addition, in each plot of the coil elements 106a to 106d in FIG. 7, the Y-coordinate value (the vertical axis value) indicates the provisional position of each of the coil elements 106a to 106d (i.e. the position on the Z axis the apparatus coordinate system where the reception intensity of MR signals is the highest).

However, as to the provisional position (the Y-coordinate value) of each of the coil elements 106a to 106d, the Z axis position of the gravity point (barycentric position) of MR signal intensity of the profile data may be alternatively used. The above gravity point means, for example, the Z axis position where the Z-integrated value of MR signal intensity becomes a half of the total Z-integrated value of MR signal intensity, and this is determined after calculating the above total Z-integrated value by integrating MR signal intensity in the Z axis direction within the range of the Z axis direction for which the measurement has been performed.

The position calculating unit 66 performs straight-line approximation on the four plots of the coil elements 106a to 106d in the graph of FIG. 7, on the basis of the least-square method. The position calculating unit 66 calculates the y-intercept of this straight-line as the gap D1 between the position of the representative point Q1 and the original point of the apparatus coordinate system. Thereby, the position calculating unit 66 calculates the position of the representative point Q1 on the basis of the apparatus coordinate system.

In the way similar to the above manner, the position calculating unit 66 calculates the position of the representative point Q2 by calculating the gap D2 between the position of the representative point Q2 of the spine RF coil device 120 and the original point of the apparatus coordinate system.

Note that, as to the method of calculating the position of the representative point on the basis of the provisional position and the coil position data, other methods aside from the above least-square method may be alternatively used. This point will be further explained later as the supplementary note [5] of the present embodiment.

[Step S8] The position calculating unit 66 calculates the actual position of each of the coil elements 106a to 106d of the lower limb RF coil device 100, on the basis of the position of the representative point Q1 calculated in Step S7 and the coil position data. For example, if the y-intercept IP1 (the gap D1) in FIG. 7 is calculated as +67 and the z-coordinate position of the representative point Q1 is calculated as +67, the position calculating unit 66 shifts the position of each coil element in the coil position data by 67 in the positive direction along the Z axis. For example, the position of the coil element 106d on the Z axis is calculated as 367.

In the way similar to the above manner, the position calculating unit 66 calculates the actual position of each of the coil elements 126a to 126h of the spine RF coil device 120, on the basis of the position of the representative point Q2 calculated in Step S7 and the coil position data. For example, if the gap D2 is calculated as −100 and the z-coordinate position of the representative point Q2 is calculated as −100, the position calculating unit shifts the position of each coil element in the coil position data by 100 in the negative direction along the Z axis.

The foregoing is the explanation of the operation of the coil position measuring sequence.

Figure 9:
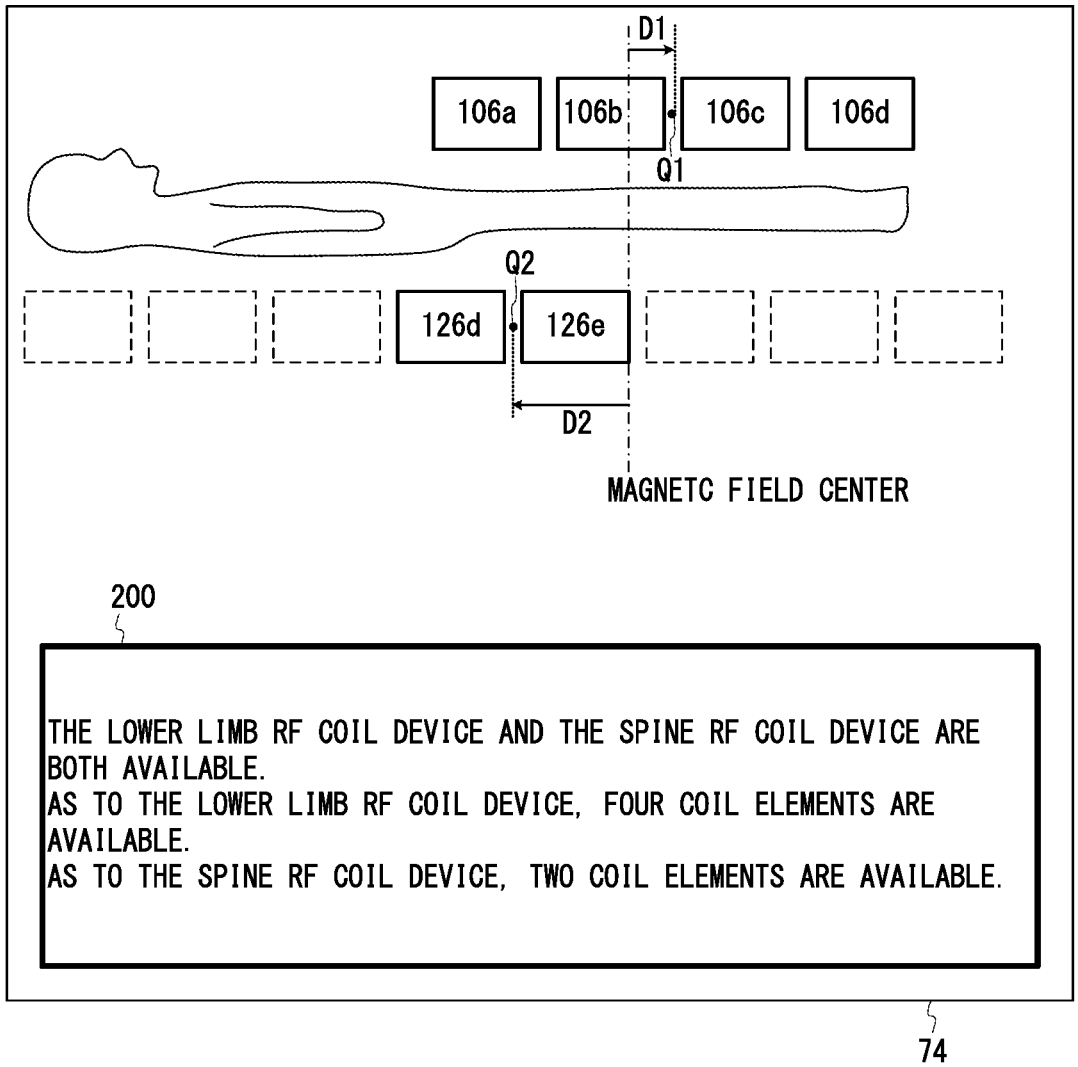
FIG. 9 is a schematic diagram showing an example of the arrangement of each coil element displayed after performance of the coil position measuring sequence.

FIG. 9 is a schematic diagram showing an example of the arrangement of the respective coil elements displayed after performance of the coil position measuring sequence.

As an example in the present embodiment, the display device 74 displays the result of the judgment of availability for each of the RF coil devices, on a guide field 200 of the viewing surface of the display device 74. In the example of FIG. 4 to FIG. 9, it is displayed in the guide field 200 that both of the lower limb RF coil device 100 and the spine RF coil device 120 are available.

As an example here, the display device 74 does not display the positional information on the coil elements of the RF coil device (judged to be unavailable) whose representative point has not been subjected to the positional calculation. Instead, the display device 74 displays the positional information on the coil elements of the RF coil device (judged to be available) whose representative point has been subjected to the positional calculation and is positionally specified.

For example, if one RF coil device is subjected to the positional calculation of the representative position due to being judged to be available and another RF coil device is judged to be unavailable, the display unit 74 displays positional information on the coil elements of the RF coil device judged to be available, without displaying positional information on the coil elements of said another RF coil device.

In addition, out of the coil elements selected for the judgment of availability in Step S3, the display device 74 distinguishably displays only coil elements, each of which has reception intensity at the peak equal to or higher than the threshold value Th, as available coil elements as an example here.

As to the decision criterion of the coil elements distinguishably displayed as available coil elements in the RF coil device judged to be available in Step S5, another criterion aside from the threshold value Th may be used. In addition, as to this distinguishable display, the display device 74 displays a bold frame of each coil element so as to accord with the position of the coil element whose position is calculated in Step S8, by using the position of the magnetic field center as a benchmark on the viewing surface. Inside each bold frame, the identification information of the corresponding coil element is displayed.

In the example of FIG. 4 to FIG. 9, the coil elements 106a to 106d are displayed as available coil elements for the lower limb RF coil device 100, and the coil elements 126d and 126e are displayed as available coil elements for the spine RF coil device 120. In addition, in FIG. 9, the position of the magnetic field center in the Z axis direction is indicated as an alternate long and short dash line in the vertical direction.

As to every coil element whose reception intensity at the peak is lower than the threshold value Th (i.e. the coil elements that are not suitable for using), their display may be omitted, or such coil elements may be displayed with aspects discriminated from the available coil elements. In FIG. 9, dashed line frames of the coil elements that are not suitable for using are displayed so as to accord with the positions of these coil elements calculated by the position calculating unit 66.

In addition, the judging unit 65 calculates the existence region of the object P on the basis of the information on the object P such as the body height and the detected range of MR signals in the profile data of all the coil elements, and inputs the calculation results to the display device 74. Then, the display device 74 displays the inputted existence region of the object P with the arrangement of the respective coil elements.

Operation Explanation of the Present Embodiment

Figure 10:
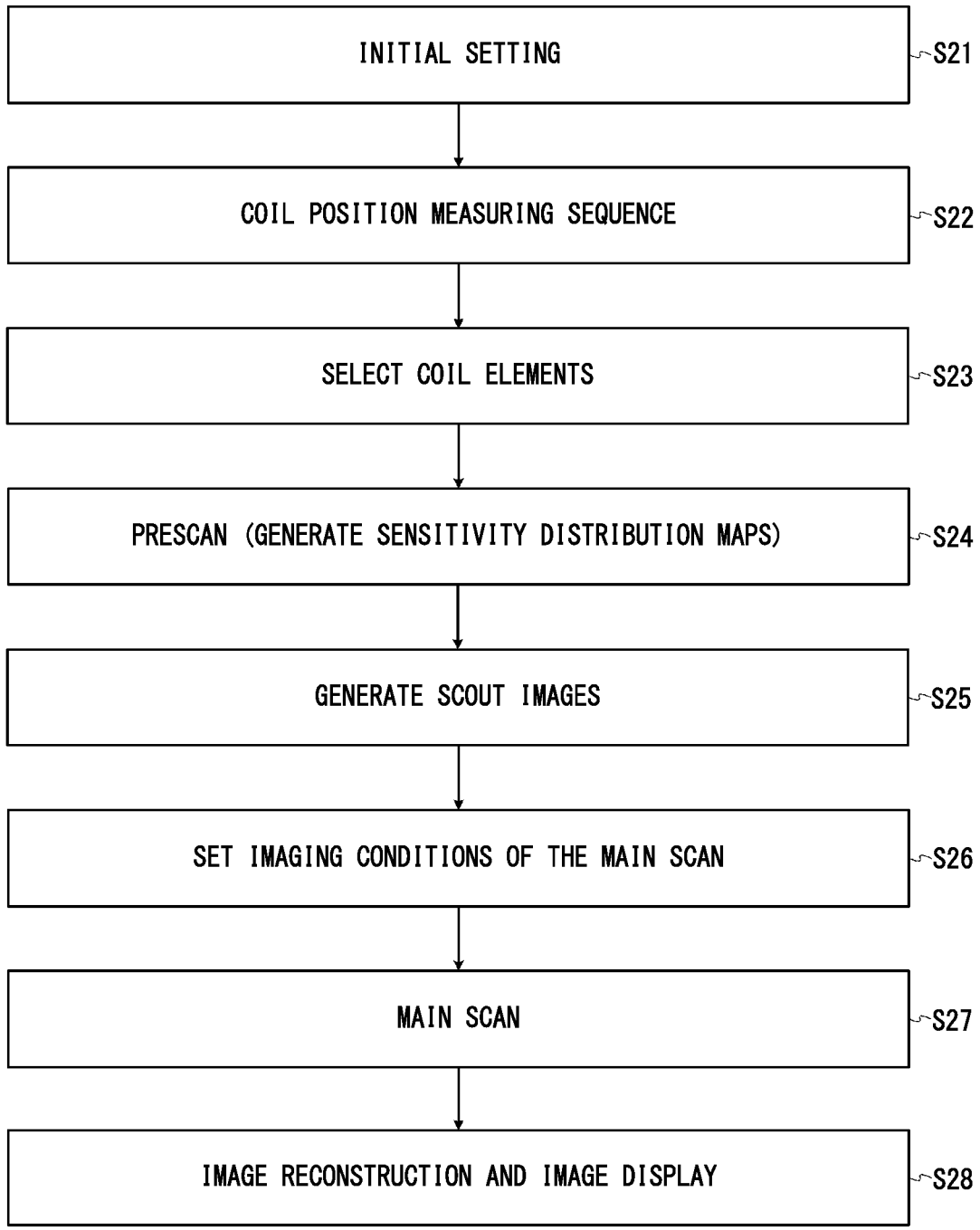
FIG. 10 is a flowchart illustrating an example of a flow of an imaging operation performed by the MRI apparatus of the present embodiment.

FIG. 10 is a flowchart illustrating an example of a flow of an imaging operation performed by the MRI apparatus 10 of the present embodiment. In the following, according to the step numbers in the flowchart shown in FIG. 10, the imaging operation of the MRI apparatus 10 will be described by referring to the aforementioned FIG. 1 to FIG. 9 as required.

[Step S21] The main imaging conditions such as the body height of the object P and a type of pulse sequence are inputted to the input device 72. The system control unit 61 (see FIG. 1) performs initial setting of the MRI apparatus 10 on the basis of the imaging conditions inputted to the MRI apparatus 10 via the input device 72.

In addition, the lower limb RF coil device 100 and the spine RF coil device 120 are respectively loaded on the object P on the table 22, and these RF coil devices are respectively connected to the connection ports 25.

The system control unit 61 obtains the identification information of these connected RF coil devices via the connection ports 25.

After this, the table moving structure 23 horizontally moves the table 22, on which the object P is loaded, into inside of the gantry 30 in accordance with the control of the sequence controller 58 and the system control unit 61.

After this, a provisional center frequency of RF pulses and so on are determined (selected) by a prescan or the like.

[Step S22] The system control unit 61 controls each component of the MRI apparatus 10 so as to perform the aforementioned the coil position measuring sequence (see FIG. 3 to FIG. 8).

[Step S23] The judging unit 65 and the position calculating unit 66 input the execution results of the coil position measuring sequence into the display device 74. The display device 74 distinguishably displays available RF coil device(s) and available coil element(s), on the basis of the execution results of the coil position measuring sequence (see FIG. 9). At this time, the display device 74 displays each of the available coil element(s) so as to accord with its position calculated in the coil position measuring sequence, by using the magnetic field center as a benchmark.

After this, out of the available coil elements displayed on the display device 74, the coil elements used for imaging are selected by a user. The coil selection unit 67 respectively inputs predetermined control signals to the lower limb RF coil device 100 and the spine RF coil device 120, so that the coil elements selected by a user via the input device 72 are used for imaging (the coil selection unit 67 receives input information designating specified coil elements out of the displayed coil elements from the input device 72, and selects the specified coil elements according to the input information). The above "used for imaging" means that MR signals detected by the selected coil elements in the main scan are used for image reconstruction.

Note that, selection of the coil elements used for imaging may be automatically performed by the coil selection unit 67 on the basis of the imaging conditions such as an imaging part. In addition, each component of the MRI apparatus 10 as well as the input device 72 are configured to perform the processing of Step S22 again in accordance with command of re-execute by a user, if a user has a doubt about the displayed execution results of the coil position measuring sequence.

[Step S24] Prescans such as a sequence of generating a (spatial) three-dimensional sensitivity distribution map of each coil element inside the lower limb RF coil device 100 and the spine RF coil device 120 are performed. As to the method of generating a sensitivity distribution map, it may be the same as the conventional technology described in Japanese Patent Application Laid-open (KOKAI) Publication No. 2005-237703, for example.

[Step S25] Scout images are imaged. More specifically, from the timing of Step S22, the object P is loaded on the table 22 inserted inside the gantry 30, and a static magnetic field is formed in the imaging space by the static magnetic field magnet 31 excited by the static magnetic field power supply 42. Then, electric current is supplied from the shim coil power supply 44 to the shim coil 32 so as to form an offset magnetic field, thereby the static magnetic field formed in the imaging space is uniformed.

Furthermore, when the system control unit 61 receives a start command of imaging from the input device 72, the system control unit 61 inputs imaging conditions including a pulse sequence into the sequence controller 58. Then, the sequence controller 58 drives the gradient magnetic field power supply 46, the RF transmitter 48 and the RF receiver 50 in accordance with the inputted pulse sequence, thereby gradient magnetic fields are formed in the imaging region including the imaging part of the object P, and RF pulses are generated from the RF coil unit 34.

Thus, MR signals generated by nuclear magnetic resonance inside the object P are detected by the RF coil unit 34 and the coil elements (of the lower limb RF coil device 100 and/or the spine RF coil device 120) selected in Step S23, and inputted to the RF receiver 50.

The RF receiver 50 performs the aforementioned predetermined signal processing on the detected MR signals so as to generate the raw data of MR signals, and inputs these raw data into the image reconstruction unit 62.

The image reconstruction unit 62 arranges and stores the raw data of MR signals as k-space data.

The image reconstruction unit 62 reconstructs image data by performing image reconstruction processing including Fourier transformation on the k-space data, and stores the reconstructed image data in the image database 63.

The image processing unit 64 obtains the image data from the image database 63 and generates display image data of the scout images by performing predetermined image processing on the obtained image data.

The image processing unit 64 stores the display image data of the scout images in the storage device 76. After this, the system control unit 61 makes the display device 74 display images indicated by the display image data of the scout images.

[Step S26] On the basis of the displayed scout images, some of the imaging conditions of the main (selects) other unconfirmed imaging conditions of the main scan.

[Step S27] The main scan is performed in accordance with the imaging conditions selected in Step S26. Thereby, each component operates in the way similar to the imaging of the scout images, and the raw data of the MR signals of the main scan are arranged and stored in the image reconstruction unit 62 as k-space data.

[Step S28] The image reconstruction unit 62 reconstructs image data by performing image reconstruction processing including Fourier transformation on the k-space data, and performs luminance correction processing on the reconstructed image data on the basis of the sensitivity distribution maps.

The image reconstruction unit 62 stores the image data subjected to the luminance correction processing in the image database 63.

The image processing unit 64 obtains the image data from the image database 63 and generates two-dimensional display image data by performing predetermined image processing on the obtained image data. The image processing unit 64 stores the display image data in the storage device 76.

After this, the system control unit 61 makes the display device 64 display images indicated by the display image data as images of the main scan. The foregoing is a description of an operation of the MRI apparatus 10 of the present embodiment.

Effects of the Present Embodiment

In some cases, a plurality of wearable type of RF coil devices are used for imaging and the reception sensitivity is greatly different from one RF coil device to another. For example, when the cushion 96 is laid under the knees of the object P like FIG. 2, the reception sensitivity is greatly different between each coil element of one RF coil device and each coil element of another RF coil device. This is because the distance from the object P is greatly different from one RF coil device to another. Because MR signals are weak, the reception sensitivity of each coil element in an RF coil device which is largely distant from the object P becomes relatively small.

Under such circumstances, in some cases in the conventional technology, an RF coil device is not displayed (as inappropriate for using) because every coil element inside this RF coil device does not have a value in the reception intensity over a predetermined value. For example, in the arrangement like FIG. 2, in some cases in the conventional technology, the lower limb RF coil device 100 is displayed, whereas the spine RF coil device 120 separated away from the object P by the cushion 96 is not displayed.

Here, because the linearity of gradient magnetic fields degrades at greater distances from the magnetic field center, the detection accuracy of MR signals deteriorates at greater distances from the magnetic field center.

That is, even if the peak position of detected signals is identified, it becomes difficult to judge which of the following options this peak corresponds to: (a) the peak of noise, (b) the peak due to coupling effects between coil elements, or (c) the peak of the MR signals from the object P which should be essentially detected.

Thus, a coil element located at a greater distance from the magnetic field center is more likely to show a peak position of the received signal that is different from the peak position of the MR signal to be detected.

Then, in the present embodiment, the following novel algorithm is adopted. That is, in judging availability of each of the RF coil devices, whether this RF coil device is located near the magnetic field center or not is determined.

Concretely speaking, firstly, the coil elements whose peak positions of the received signals are greatly different from the peak positions of the MR signals from the object P are excluded from the judgment of availability in Step S3. This is because only coil elements, whose gaps $\Delta Z$ and $AZ'$ from the positions indicated by the coil position data are within the acceptable range, are selected.

Out of these selected coil elements whose peak positions are trustworthy, the statistical threshold value Th is calculated on the basis of the respective peak levels of these selected coil elements (Step S4). Then, if at least one out of these selected coil elements whose peak positions are trustworthy has a peak value of the reception intensity equal to or higher than the threshold value Th, the RF coil device is judged to be available because it is located near the magnetic field center (Step S5). This is because it can be said that at least one coil element, which is located close to the magnetic field center so as to show a trustworthy peak position and has a sufficient reception sensitivity, exists inside such an RF coil device.

Thus, it can be judged whether each of the RF coil devices can be used or not, with extremely high trustworthiness.

In addition, in the conventional technology, if the coil elements inside the RF coil device are separated from the object P by the cushion 96 or the like, it causes the reception intensity of MR signals to become weak and the position of this RF coil device is neither automatically detected nor displayed. However, the above conventional problem lessens, because the following possibility that the peak positions of the trustworthy coil elements become equal to or more than the statistical threshold value causing the RF coil device to be judged available becomes strong.

Then, out of the coil elements of the RF coil device judged to be available, coil elements, whose peak values of the reception intensity of MR signals are not lower than the predetermined proportion RA of the maximum reception intensity (CAmax or CBmax), are selected for calculating the position of the representative point (Q1 or Q2).

As just described, only coil elements with sufficient reception sensitivity are selected, and then an approximated straight line is calculated on the basis of these provisional positions (peak positions) and relative positions indicated by the coil position data, so as to calculate its intercept as the position of the representative point (Step S7). Thus, the position of the representative point can be accurately calculated. As the result of the accurately calculated position of representative point, the position of each coil element can be exactly calculated on the basis of the coil position data (Step S8).

According to the aforementioned embodiment, the position of the RF coil device in MRI can be detected more accurately than the conventional technology. In addition, the coil element(s) effective for imaging in MRI can be judged. The above "the coil element effective for imaging" means, for example, a coil element whose location gives reception sensitivity high enough to obtain satisfactory image quality.

Supplementary Notes on the Present Embodiment

[1] In the present embodiment, an example in which the profile data are generated per coil element and the judgment of availability of each RF coil device and the positional calculation of the representative point are performed on the basis of the profile data of the coil elements has been explained. These operations may be performed not per coil element but per section.

Figure 11:
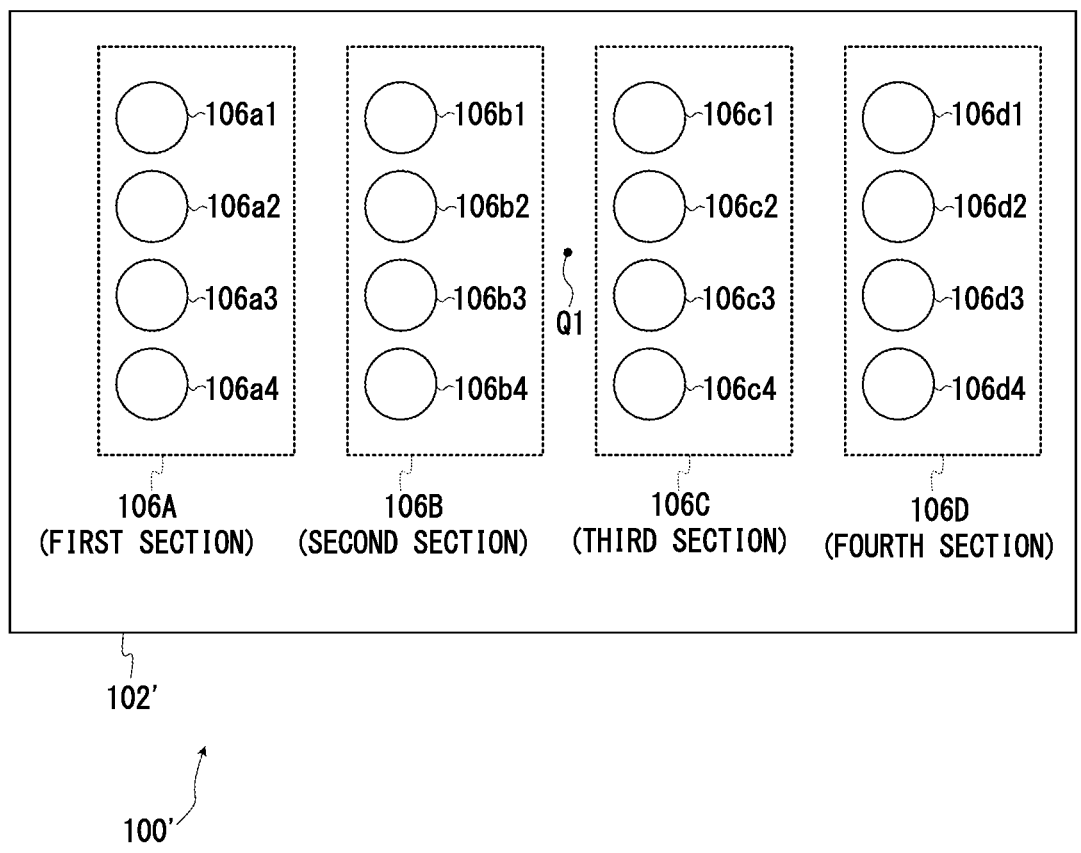
FIG. 11 is a schematic planimetric diagram showing an example of arranging the coil elements of the lower limb RF coil device per section.

FIG. 11 is a schematic planimetric diagram showing an example of arranging the coil elements of the lower limb RF coil device 100' per section.

In FIG. 11, inside a cover member 102' of the lower limb RF coil device 100', four coil-element-sets of the first section 106A, the second section 106B, the third section 106C and the fourth section 106D are disposed.

The first section 106A includes four coil elements $106a1$ to $106a4$, the second section 106B includes four coil elements $106b1$ to $106b4$, the third section 106C includes four coil elements $106c1$ to $106c4$, and the fourth section 106D includes four coil elements $106d1$ to $106d4$.

Here, each pathway of a plurality of MR signals from each RF coil device to the RF receiver 48 is defined as a "channel" (these MR signals are outputted from each RF coil device and inputted to the RF receiver 50). The number of "channel" is set to a number equal to or less than the receivable input number of the RF receiver 50. Thus, an MR signal transmitted in each channel and inputted to the RF receiver 50 as one signal consists of an MR signal of one coil element in some cases, or it is a composite signal of respective MR signals of a plurality of coil elements in other cases.

The composite processing is performed by respectively converting MR signals from the plurality of coil elements into (a) coordinate phase, (b) opposite phase, (c) QD (quadrature), (d) half QD or the like inside the RF coil device and summing up them, in such a manner that the original signals subjected to the composite processing can be separated into the original signals, for example.

Thus, an MR signal detected by any one of the four coil elements 106a1 to 106a4 of the first section 106A is defined as the (representative) MR signal of the first section 106A, and the profile data of the first section 106A may be generated on the basis of this representative MR signal. Alternatively, the profile data of the first section 106A may be generated on the basis of one signal obtained by synthesizing four MR signals respectively detected by the coil elements 106a1 to 106a4.

By generating the profile data for the second section 106B, the third section 106C and the fourth section 106D in the way similar to the above manner, the judgment of availability of the lower limb RF coil device 100' can be performed on the basis of the profile data of each section in the way similar to the above embodiment.

In addition, if the lower limb RF coil device 100' is judged to be available, the positional calculation of the representative point Q1 can be calculated and it can be judged which of the first to fourth sections (106A to 106D) is available, in the way similar to the above embodiment.

[2] In the above embodiment, an example in which the position of the representative point is calculated has been explained. However, embodiments of the present invention are not limited to such an aspect. Although the representative point means, for example, a predetermined coordinate point in a representative part which is a range with extensity, the position of the representative part may be calculated instead of the representative point. In this specification, a representative part is assumed to be an expression meaning a broader concept of a representative point.

[3] In the above embodiment, an example in which the profile data of the reception intensity distribution of MR signals are one-dimensionally generated along the horizontal moving direction (the Z axis direction) of the table 22 and the positions of the representative points Q1 and Q2 and each coil element are one-dimensionally calculated has been explained. However, embodiments of the present invention are not limited to such an aspect.

The profile data may be generated two-dimensionally or three-dimensionally, and the positions of the representative points Q1 and Q2 and each coil element may be calculated three-dimensionally.

When they are three-dimensionally calculated, the coil position data are stored in the judging unit 65 as three-dimensional coordinate of the representative point of each coil element in the case of placing the RF coil device along a predetermined direction, by using the representative point of the RF coil device as the original point, for example. The above predetermined direction means, for example, a direction that makes the arrangement direction of the coil elements accords with the Z axis direction. Next, MR signals are acquired three-dimensionally, for example, and the profile data are three-dimensionally generated.

Next, the gap between the three-dimensional coordinate of the peak of the reception intensity of MR signals in the profile data and the three-dimensional coordinate of the representative point of each coil element indicated by the coil position data is calculated as a three-dimensional vector. By using this three-dimensional vector as the judging criterion in the way similar to the above embodiment, the judgment of availability of the RF coil device, the positional calculation of the representative point of the RF coil device and the positional calculation of each coil element can be performed in the way similar to the above embodiment.

[4] In the above embodiment, an example in which the judgment of availability and the positional calculation of the representative point are performed on the lower limb RF coil device 100 for receiving only and the spine RF coil device 120 for receiving only has been explained. However, embodiments of the present invention are not limited to such an aspect. The judgment of availability, the positional calculation of the representative point or the like can be performed on bidirectional RF coil devices in the way similar to the above embodiment.

[5] In Step S7 (FIG. 8) of the coil position measuring sequence, an example in which the plots of the coil elements 106a to 106d are subjected to the straight-line approximation by using the least-square method like FIG. 7 and the position of each of the representative points Q1 and Q2 of the lower limb RF coil device 100 and the spine RF coil device 120 is calculated has been explained. As to methods of calculating a position of a representative point of an RF coil device on the basis of a provisional position and coil position data, other methods may be alternatively used aside from the least-square method.

For example, the gap between the provisional position (the position of the peak of MR signals in the Z axis direction) and the position of each of the coil elements 106a to 106d indicated by the coil position data like FIG. 3 (by using the representative point Q1 as a benchmark) is calculated for the respective coil elements 106a to 106d of the lower limb RF coil device 100. Then, the average value of these four gaps may be determined as the position of the representative point Q1 in the Z axis direction of the apparatus coordinate system (these gaps are slightly different from the ΔZa to ΔZd in the aforementioned embodiment in that shift processing with the use of the provisional position of the coil element 106b giving the maximum reception intensity CAmax as a criterion is not performed). The same holds true for the spine RF coil device 120 and other RF coil devices.

[6] In the above embodiment, an example in which the coil position data are stored per RF coil device, the position of the representative point (Q1 or Q2) of each of the RF coil devices is calculated and the position of each coil element is calculated on the basis of the position of the representative point and the coil position data has been explained. However, embodiments of the present invention are not limited to such an aspect. Neither the storage of the coil position data nor the positional calculation of the representative point is indispensable.

For example, for each of the coil elements, its peak position of the reception intensity of MR signals may be treated as its position, availability may be judged per RF coil device, and the coil elements effective for imaging may be selected (distinguishably displayed) by using the same algorithm as the above embodiment for all of the other processes.

[7] Correspondences between terms used in the claims and terms used in the embodiment described above will be described. Note that the correspondences described below are just some of possible interpretations for reference and should not be construed as limiting the present invention.

Out of the lower limb RF coil device 100 and the spine RF coil device 120, one is an example of the first RF coil device described in the claims and the other is an example of the second RF coil device described in the claims.

The display device 74 is an example of the display unit described in the claims.

The judging unit 65 that stores the coil position data per RF coil device is an example of the coil position data storing unit described in the claims.

[8] While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus comprising:
    an assembly of MRI gantry components including static and gradient magnetic field generators and at least one radio frequency (RF) coil defining an imaging volume;
    a first coil device and a second coil device, each of the first and second coil devices including a plurality of coil elements; and
    an MRI control system, connected to control the gantry components, including at least one RF transmitter, at least one RF receiver and computer control circuits connected to effect specified MRI data acquisition sequences of RF and gradient magnetic pulses which acquire, from an object located within the imaging volume, RF nuclear magnetic resonance (NMR) spin responses emanating from the object, the computer control circuits configured to:
    generate a plurality of profile data respectively corresponding to the plurality of coil elements and indicating reception intensity distributions of NMR signals from the object detected by the plurality of coil elements of each of the first RF coil device and the second RF coil device,
    set a statistical threshold value based on a peak value of reception intensity of the NMR signals in each of the plurality of profile data,
    select at least one of the first RF coil device and the second RF coil device available for calculating respective positions thereof, based on a number of coil elements which have reception intensity of the NMR signals in the profile data equal to or larger than the statistical threshold value, and
    use RF coil elements included in the at least one RF coil device selected as available, for acquiring MRI data in a main imaging pulse sequence,
    wherein the computer control circuits are configured to set the statistical threshold value based on an average and dispersion of each peak value.

2. A magnetic resonance imaging (MRI) apparatus comprising:
    an assembly of MRI gantry components including static and gradient magnetic field generators and at least one radio frequency (RF) coil defining an imaging volume;
    a first coil device and a second coil device, each of the first and second coil devices including a plurality of coil elements; and
    an MRI control system, connected to control the gantry components, including at least one RF transmitter, at least one RF receiver and computer control circuits connected to effect specified MRI data acquisition sequences of RF and gradient magnetic pulses which acquire, from an object located within the imaging volume, RF nuclear magnetic resonance (NMR) spin responses emanating from the object, the computer control circuits configured to:
    generate a plurality of profile data, the profile data respectively corresponding to the plurality of coil elements and indicating reception intensity distributions of NMR signals from the object detected by the plurality of coil elements of each of the first RF coil device and the second RF coil device,
    set a statistical threshold value based on a peak value of reception intensity of the nuclear magnetic resonance signals in each of the plurality of profile data,
    select at least one of the first RF coil device and the second RF coil device available for calculating respective positions thereof, based on proportion of coil elements which have reception intensity of the NMR signals in the profile data equal to or larger than the statistical threshold value, and
    use RF coil elements included in the at least one RF coil device selected as available, for acquiring MRI data in a main imaging pulse sequence,
    wherein the computer control circuits are configured to set the statistical threshold value based on an average and dispersion of each peak value.

3. A guiding method of coil selection in magnetic resonance imaging (MRI) that obtains guide information for selecting a coil element used for MRI in an RF coil device loaded on an object, the guiding method of coil selection in MRI comprising:
    generating a plurality of profile data that respectively corresponding to a plurality of coil elements and indicating reception intensity distributions of nuclear magnetic resonance (NMR) signals from an object detected by the plurality of coil elements of each of a first RF coil device and a second RF coil device;
    setting a statistical threshold value based on a peak value of reception intensity of the NMR signals in each of the plurality of profile data;
    select at least one of the first RF coil device and the second RF coil device available for calculating respective positions thereof, based on a number or proportion of coil elements which have reception intensity of the NMR signals in the profile data equal to or larger than the statistical threshold value, and
    using RF coil elements included in the at least one RF coil device selected as available, for acquiring MRI data in a main imaging pulse sequence,
    wherein the computer control circuits are configured to set the statistical threshold value based on an average and dispersion of each peak value.

* * * * *